United States Patent
Huang

(10) Patent No.: US 9,431,978 B2
(45) Date of Patent: Aug. 30, 2016

(54) COMMON-MODE FEEDBACK DIFFERENTIAL AMPLIFIER

(71) Applicant: Fairchild Semiconductor Corporation, San Jose, CA (US)

(72) Inventor: Lei Huang, Beijing (CN)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 63 days.

(21) Appl. No.: 14/448,855

(22) Filed: Jul. 31, 2014

(65) Prior Publication Data

US 2015/0035598 A1    Feb. 5, 2015

(30) Foreign Application Priority Data

Jul. 31, 2013 (CN) .......................... 2013 1 0335404

(51) Int. Cl.
*H03F 3/45* (2006.01)

(52) U.S. Cl.
CPC ...... *H03F 3/45183* (2013.01); *H03F 3/45475* (2013.01); *H03F 3/45636* (2013.01); *H03F 3/45* (2013.01); *H03F 2003/45022* (2013.01); *H03F 2200/129* (2013.01); *H03F 2203/45442* (2013.01); *H03F 2203/45528* (2013.01); *H03F 2203/45591* (2013.01)

(58) Field of Classification Search
CPC .......... H03F 3/45659; H03F 3/45183; H03F 3/45475; H03F 3/45479; H03F 2203/45424; H03F 3/45071; H03F 1/34

USPC ......................................................... 330/258
See application file for complete search history.

(56) References Cited

U.S. PATENT DOCUMENTS

| | | | |
|---|---|---|---|
| 4,525,677 A * | 6/1985 | Rorden | H03F 3/45479 330/258 |
| 6,469,578 B1 | 10/2002 | Smith | |
| 6,603,355 B2 * | 8/2003 | Delano | H03F 3/45941 330/258 |
| 6,781,456 B2 | 8/2004 | Pradhan | |
| 2008/0272842 A1 * | 11/2008 | Lee | H03F 1/301 330/258 |
| 2013/0263665 A1 | 10/2013 | Opris et al. | |

* cited by examiner

*Primary Examiner* — Khanh V Nguyen

(74) *Attorney, Agent, or Firm* — Schwegman Lundberg & Woessner, P.A.

(57) ABSTRACT

The present invention discloses a common-mode feedback differential amplifier circuit, a common-mode feedback differential amplification method, and an integrated circuit. In an example, a common-mode feedback (CMFB) loop conducts voltage division on a first common-mode signal to generate a second common-mode signal and a third common-mode signal, a differential amplifier sets a voltage of the signal with the higher voltage between the second common-mode signal and the third common-mode signal equal to a voltage of a first input terminal or a second input terminal, and the CMFB loop controls the differential amplifier to output an output signal with the minimum voltage equal to the voltage of the first common-mode signal.

21 Claims, 5 Drawing Sheets

COMMON-MODE FEEDBACK DIFFERENTIAL AMPLIFIER

CLAIM OF PRIORITY

The application claims the benefit of priority under 35 U.S.C. §119(a) to Lei Huang, CN Application No. 2013103354041, filed on Jul. 31, 2013, which is hereby incorporated by reference in its entirety.

TECHNICAL FIELD

The present disclosure relates to differential amplifier circuits, more particularly to a common-mode feedback differential amplifier circuit, a common-mode feedback differential amplification method, and an integrated circuit.

BACKGROUND

Because of their circuit parameter symmetry and negative feedback function, differential amplifier circuits are capable of effectively stabilizing a quiescent operating point, amplifying a differential-mode signal, and suppressing a common-mode signal, and thus they have been widely used at the input stages of directly coupled circuits and measurement circuits.

In differential amplifier circuits, a differential amplifier typically needs a common-mode feedback (CMFB) loop, wherein the CMFB circuit is configured to set a common-mode voltage. At present, many electronic products require low power consumption, and therefore differential amplifiers for use in the electronic products must also strive for reduced power consumption.

Overview

To address the technical problems in the prior art, the present disclosure provides a common-mode feedback differential amplifier circuit, a common-mode feedback differential amplification method, and an integrated circuit. In an example, a common-mode feedback (CMFB) loop conducts voltage division on a first common-mode signal to generate a second common-mode signal and a third common-mode signal, a differential amplifier sets a voltage of the signal with the higher voltage between the second common-mode signal and the third common-mode signal equal to a voltage of a first input terminal or a second input terminal, and the CMFB loop controls the differential amplifier to output an output signal with the minimum voltage equal to the voltage of the first common-mode signal. With the technical solutions of the present invention, during processing of the second common-mode signal and the third common-mode signal by the differential amplifier at an input stage, no high-voltage power source needs to be coupled, and in addition no resistance division needs to be conducted for the voltage between output signals to implement common-mode feedback, thereby reducing the power consumption.

The technical solutions of the present disclosure can be implemented as follows:

The present disclosure provides a common-mode feedback differential amplifier circuit, comprising a CMFB loop and a differential amplifier, wherein: the CMFB loop is configured to perform voltage division on a first common-mode signal to generate a second common-mode signal and a third common-mode signal, output the second common-mode signal and the third common-mode signal to the differential amplifier, and control, according to the negative feedback principle, the differential amplifier to output an output signal with a minimum voltage equal to a voltage of the first common-mode signal; and the differential amplifier is configured to receive the second common-mode signal and the third common-mode signal, set a voltage of the signal with the higher voltage between the second common-mode signal and the third common-mode signal equal to a voltage of a first input terminal or a second input terminal, and output, under control of the CMFB loop, the output signal with the minimum voltage equal to the voltage of the first common-mode signal.

The present disclosure further provides a common-mode feedback differential amplification method, including: performing voltage division on a first common-mode signal using a differential amplification circuit to generate a second common-mode signal and a third common-mode signal; receiving the second common-mode signal and the third common-mode signal at an input stage using a differential amplifier in the differential amplifier circuit, and setting a voltage of the signal with the higher voltage between the second common-mode signal and the third common-mode signal equal to the voltage of the first input terminal or the second input terminal; and using the differential amplifier circuit according to the negative feedback principle, to control the differential amplifier to output an output signal with a minimum voltage equal to a voltage of the first common-mode signal.

The present disclosure further provides an integrated circuit, comprising a common-mode feedback differential amplifier circuit, the differential amplifier circuit comprising a common-mode feedback (CMFB) loop and a differential amplifier, wherein: the CMFB loop is configured to conduct voltage division on a first common-mode signal to generate a second common-mode signal and a third common-mode signal, output the second common-mode signal and the third common-mode signal to the differential amplifier, and control, according to a negative feedback principle, the differential amplifier to output an output signal with a minimum voltage equal to a voltage of the first common-mode signal; and the differential amplifier is configured to receive the second common-mode signal and the third common-mode signal, and to take the voltage of the signal with higher voltage between that of the second common-mode signal and the third common-mode signal, and set it to a voltage of a first input terminal or a second input terminal, and output, under control of the CMFB loop, the output signal with the minimum voltage equal to the voltage of the first common-mode signal.

Embodiments of the present disclosure provide a common-mode feedback differential amplifier circuit, a common-mode feedback differential amplification method, and an integrated circuit. A CMFB loop conducts voltage division on a first common-mode signal to generate a second common-mode signal and a third common-mode signal, a differential amplifier sets a voltage of the signal with the higher voltage between the second common-mode signal and the third common-mode signal equal to a voltage of a first input terminal or a second input terminal, and the CMFB loop controls the differential amplifier to output an output signal with the minimum voltage equal to the voltage of the first common-mode signal. In this way, during processing of the second common-mode signal and the third common-mode signal by the differential amplifier at an input stage, no high-voltage power source needs to be coupled, and only an internal low-voltage power source is used, thus reducing power consumption. In addition, in the differential amplifier circuit according to the present disclosure, no resistance division needs to be conducted for the voltage between output signals to implement common-mode feedback, thereby preventing power consumption caused by a resistance between output signals.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
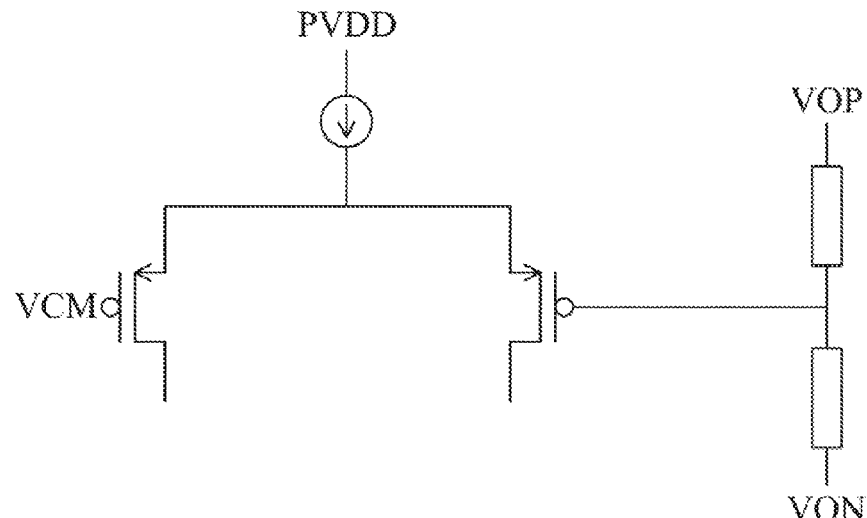
FIG. 1 is a schematic structural diagram of a common-mode feedback (CMFB) loop in a differential amplifier in the prior art.

In current common-mode feedback (CMFB) loops in conventional differential amplifiers, as illustrated in FIG. 1, in the CMFB loop, sources of two PMOS transistors are separately coupled to a negative pole of a current source, wherein a gate of one PMOS transistor is coupled to a common-mode signal VCM, a gate of the other PMOS transistor is coupled to a middle point of two voltage divider resistors, a positive pole of the current source is coupled to a power source PVDD, and the two voltage divider resistors are each coupled between two output signals VOP and VON. In this way, when the differential amplifier is operating, the CMFB loop ensures that the sum of the voltages of the two output signals VOP and VON is twice the voltage of the common-mode signal VCM. However, since the voltage of the current source is supplied by the high-voltage power source PVDD, the current flowing through the two PMOS transistors causes greater power consumption. In addition, since a greater current flows through the voltage divider resistor between the two output signals VOP and VON, this current is also supplied by the high-voltage power source PVDD and will generate greater power consumption.

In an example, a CMFB loop conducts voltage division on a first common-mode signal to generate a second common-mode signal and a third common-mode signal, a differential amplifier sets a voltage of the signal with the higher voltage between the second common-mode signal and the third common-mode signal equal to a voltage of a first input terminal or a second input terminal, and the CMFB loop controls the differential amplifier to output an output signal with the minimum voltage equal to the voltage of the first common-mode signal.

In an example, the CMFB loop described herein is capable of reducing the power consumption of a differential amplifier.

Figure 2:
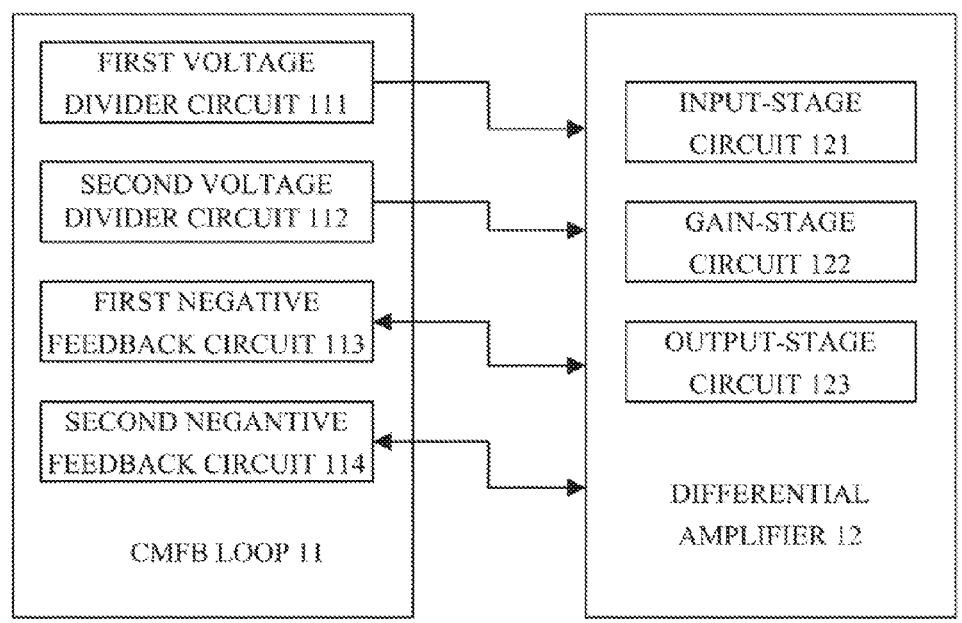
FIG. 2 is a schematic structural diagram of a common-mode feedback amplifier circuit according to an embodiment of the present disclosure.

An embodiment of the present disclosure provides a common-mode feedback differential amplifier circuit. As illustrated in FIG. 2, the differential amplifier circuit comprises a CMFB loop 11 and a differential amplifier 12.

The CMFB loop 11 conducts voltage division on a first common-mode signal to generate a second common-mode signal and a third common-mode signal and outputs the second common-mode signal and the third common-mode signal to the differential amplifier 12. The differential amplifier 12 receives the second common-mode signal and the third common-mode signal at an input stage, and sets a voltage of the signal with the higher voltage between the second common-mode signal and the third common-mode signal equal to a voltage of a first input terminal or a second input terminal. The CMFB loop 11 controls, according to the negative feedback principle, the differential amplifier 12 to output an output signal with a minimum voltage equal to the voltage of the first common-mode signal.

The first common-mode signal may typically be acquired according to an input differential signal.

The first input signal and the second input signal are differential signals.

Here, the CMFB loop 11 further comprises a first voltage divider circuit 111, a second voltage divider circuit 112, a first negative feedback circuit 113, and a second negative feedback circuit 114.

The first voltage divider circuit 111 conducts voltage division on a voltage between a first input signal and the first common-mode signal to generate the second common-mode signal, and outputs the second common-mode signal to the differential amplifier 12.

The second voltage divider circuit 112 conducts voltage division on a voltage between a second input signal and the first common-mode signal to generate the third common-mode signal, and outputs the third common-mode signal to the differential amplifier 12.

The first negative feedback circuit 113 controls, according to the negative feedback principle, the differential amplifier 12 to output a first output signal with a minimum voltage equal to the voltage of the first common-mode signal. Here, the first negative feedback circuit 113 employs a voltage divider circuit having the same voltage division ratio as the first voltage divider circuit 111, to enable the differential amplifier 12 to output the first output signal with the minimum voltage equal to the voltage of the first common-mode signal.

The second negative feedback circuit 114 controls, according to the negative feedback principle, the differential amplifier 12 to output a second output signal with a minimum voltage equal to the voltage of the first common-mode signal. Here, the second negative feedback circuit 114 employs a voltage divider circuit having the same voltage division ratio as the second voltage divider circuit 112, to enable the differential amplifier 12 to output the second output signal with the minimum voltage equal to the voltage of the first common-mode signal.

The differential amplifier 12 comprises an input-stage circuit 121, a gain-stage circuit 122, and an output-stage circuit 123.

The input-stage circuit 121 receives the second common-mode signal and the third common-mode signal, and sets the voltage of the signal with a higher voltage between the second common-mode signal and the third common-mode signal equal to the voltage of the first input terminal or the second input terminal. Here, the input-stage circuit 121 comprises a common-mode voltage selection circuit, and sets, by using the common-mode voltage selection circuit, the voltage of the signal with a higher voltage between the second common-mode signal and the third common-mode signal equal to the voltage of the first input terminal or the second input terminal; and the common-mode voltage selection circuit may be formed by a current source and a metal-oxide-semiconductor (MOS) field-effect transistor, wherein the MOS transistor may be a PMOS transistor or an NMOS transistor.

The gain-stage circuit 122 amplifies the first input signal and the second input signal.

The output-stage circuit 123 outputs, under control of the CMFB loop 11, a first output signal or a second output signal with a minimum voltage equal to the voltage of the first common-mode signal.

Here, the gain-stage circuit 122 and the output-stage circuit 123 may use the gain-stage circuit and the output-stage circuit in a present differential amplifier.

Figure 3:
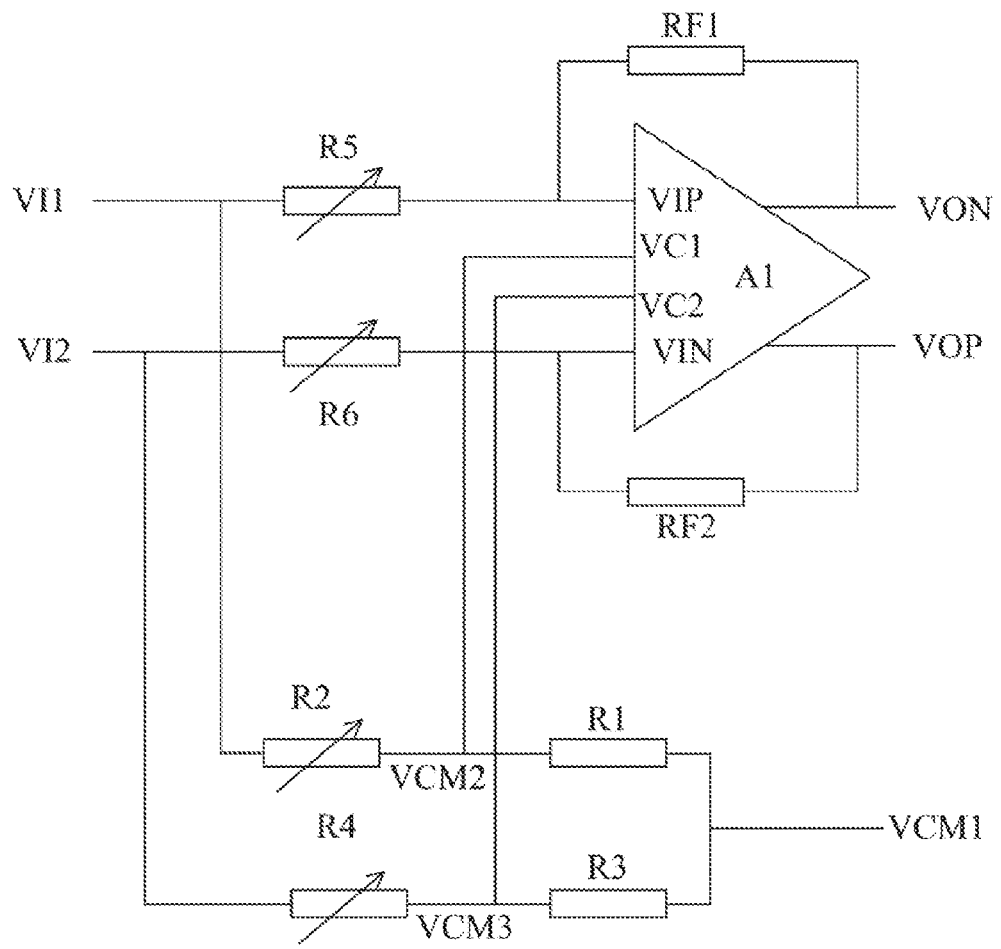
FIG. 3 is a schematic diagram of a specific circuit in a common-mode feedback amplifier circuit according to an embodiment of the present disclosure.

The specific circuit structure of the common-mode feedback differential amplifier circuit according to the present disclosure is described in detail hereinafter. As illustrated in FIG. 3, the common-mode feedback differential amplifier circuit comprises a CMFB loop composed of a first voltage divider resistor R1, a second voltage divider resistor R2, a third voltage divider resistor R3, a fourth voltage divider resistor R4, a fifth voltage divider resistor R5, a sixth voltage divider resistor R6, a first feedback resistor Rf1, and a second feedback resistor Rf2; and a differential amplifier A1.

In the CMFB loop, one terminal of the first voltage divider resistor R1 is coupled to the first common-mode signal VCM1, and the other terminal of the first voltage divider resistor R1 is coupled to the second voltage divider resistor R2 and a first common-mode input terminal VC1 of the differential amplifier A1. One terminal of the second voltage divider resistor R2 is coupled to a first input signal VI1, and the other terminal of the second voltage divider resistor R2 is coupled to the first voltage divider resistor R1 and the first common-mode input terminal VC1 of the differential amplifier. One terminal of the third voltage divider resistor R3 is coupled to the first common-mode signal VCM1, and the other terminal of the third voltage divider resistor R3 is coupled to the fourth voltage divider resistor R4 and a second common-mode input terminal VC2 of the differential amplifier A1. One terminal of the fourth voltage divider resistor R4 is coupled to a second input signal VI2, and the other terminal of the fourth voltage divider resistor R4 is coupled to the third voltage divider resistor R3 and the second common-mode input terminal VC2 of the differential amplifier A1. One terminal of the fifth voltage divider resistor R5 is coupled to the first input signal VI1, and the other terminal of the fifth voltage divider resistor R5 is coupled to the second feedback resistor Rf1 and the first input terminal VIP of the differential amplifier A1. One terminal of the sixth voltage divider resistor R6 is coupled to the second input signal VI2, and the other terminal of the sixth voltage divider resistor R6 is coupled to the second feedback resistor Rf2 and the second terminal of the differential amplifier A1. One terminal of the first feedback resistor Rf1 is coupled to the fifth voltage divider resistor R5 and the first input terminal VIP of the differential amplifier A1, and the other terminal of the first feedback resistor Rf1 is coupled to a first output terminal VON of the differential amplifier A1. One terminal of the second feedback resistor Rf2 is coupled to the sixth voltage divider resistor R6 and the second input terminal VIN of the differential amplifier A1, and the other terminal of the second feedback resistor Rf2 is coupled to a second output terminal VOP of the differential amplifier A1.

In the CMFB loop, the first voltage divider circuit is formed by the first voltage divider resistor R1 and the second voltage divider resistor R2, wherein the second common-mode signal VCM2 is generated at the middle point of the connection of the first voltage divider resistor R1 and the second voltage divider resistor R2. The second voltage divider circuit is formed by the third voltage divider resistor R3 and the fourth voltage divider resistor R4, wherein the third common-mode signal VCM3 is generated at the middle point of the connection of the third voltage divider resistor R3 and the fourth voltage divider resistor R4; the first negative feedback circuit is formed by the first feedback resistor Rf1. The second negative feedback circuit is formed by the second feedback resistor Rf2.

In the CMFB loop, the resistance ratio of the first voltage divider resistor R1 to the second voltage divider resistor R2 is the same as that of the first feedback resistor Rf1 and the fifth voltage divider resistor R5; the resistance ratio of the third voltage divider resistor R3 to the fourth voltage divider resistor R4 is the same as that of the second feedback resistor Rf2 to the sixth voltage divider resistor R6; and the second voltage divider resistor R2, the fourth voltage divider resistor R4, the fifth voltage divider resistor R5, and the sixth voltage divider resistor R6 may be variable resistors or switch capacitors.

When the common-mode feedback differential amplifier circuit as illustrated in FIG. 3 is operating, if the voltage of the first input signal VI1 is higher than that of the second input signal VI2, the voltage of the second common-mode signal VCM2 is higher than that of the third common-mode signal VCM3, the voltage of the first output signal output by the first output terminal VON of the differential amplifier A1 is lower than that of the second output signal output by the second output terminal VOP, and the voltage of the second common-mode signal VCM2 set at the input stage of the differential amplifier A1 is equal to the voltage between the first input terminal VIP and the second input terminal VIN. In this way, since the voltage of the second common-mode signal VCM2 is acquired by voltage division of the first voltage divider resistor R1 and the second voltage divider resistor R2, the voltage of the first input terminal VIP is acquired by the first feedback resistor Rf1 and the fifth voltage divider resistor R5, and the resistance ratio of first voltage divider resistor R1 to the second voltage divider resistor R2 is the same as that of the first feedback resistor Rf1 to the fifth voltage divider resistor R5, then the voltage of the first output signal output by the first output terminal VON is equal to that of the first common-mode signal VCM1. On the other hand, when the voltage of the second output signal output by the second output terminal VOP of the differential amplifier A1 is lower than that of the first output signal output by the first output terminal VON, the voltage of the second output signal output by the second output terminal VOP is equal to that of the first common-mode signal VCM1.

Figure 4:
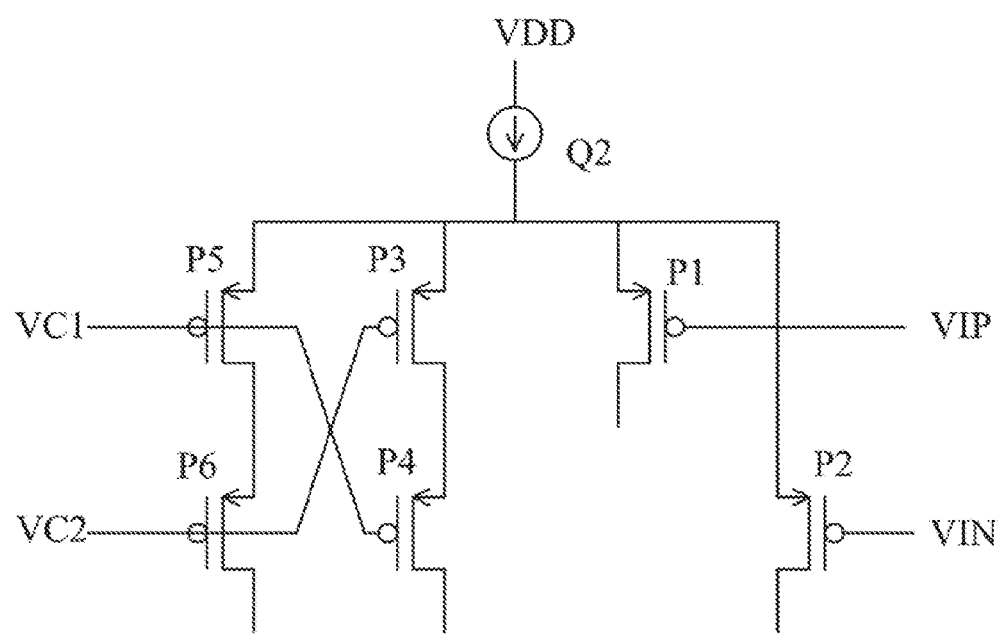
FIG. 4 is a schematic diagram of a common-mode voltage selection circuit in a differential amplifier according to an embodiment of the present disclosure.

In the common-mode feedback differential amplifier circuit as illustrated in FIG. 3, the differential amplifier A1 comprises an input-stage circuit, a gain-stage circuit, and an output-stage circuit. The input-stage circuit comprises the common-mode voltage selection circuit as illustrated in FIG. 4, and is configured to set the voltage of the signal that has the higher voltage between that of the second common-mode signal VCM2 and the third common-mode signal VCM3 equal to the voltage of the first input terminal VIP or the second input terminal VIN. The common-mode voltage selection circuit may be formed by a current source Q2 and a MOS transistor. The MOS transistor may be a PMOS transistor or an NMOS transistor. FIG. 4 uses a PMOS transistor as an example. The common-mode voltage selection circuit is formed by a current source Q2 and a first PMOS transistor, a second PMOS transistor, a third PMOS transistor, a fourth PMOS transistor, a fifth PMOS transistor, and a sixth PMOS transistor. A positive pole of the current source Q2 is coupled to an internal power source VDD, and a negative pole of the current source Q2 is separately coupled to sources of the first PMOS transistor P1, the third PMOS transistor P3, and the fifth PMOS transistor P5. The gates of the first PMOS transistor P1 and the second PMOS transistor P2 are respectively the first input terminal VIP and the second input terminal VIN of the differential amplifier A1. A gate of the third PMOS transistor P3 is coupled to a gate of the sixth PMOS transistor P6, and acts as the second common-mode input terminal VC2 of the differential amplifier A1, and is configured to receive the third common-mode signal VCM3. A gate of the fourth PMOS transistor P4 is coupled to a gate of the fifth PMOS transistor P5, acts as first common-mode input terminal VCI of the differential amplifier A1, and is configured to receive the second common-mode signal VCM2. Accordingly, the positive pole of the current source Q2 is coupled to a low-voltage internal power source VDD, instead of a high-voltage power source PVDD, thereby reducing power consumption caused by the current flowing through the first to sixth PMOS transistors P1-P6.

Here, the internal power source VDD typically supplies an internal operating voltage for the differential amplifier, and the voltage supplied by the internal power source VDD is greatly lower than the voltage supplied by the power source PVDD. The power source PVDD typically supplies a voltage for an output drive portion.

Figure 5:
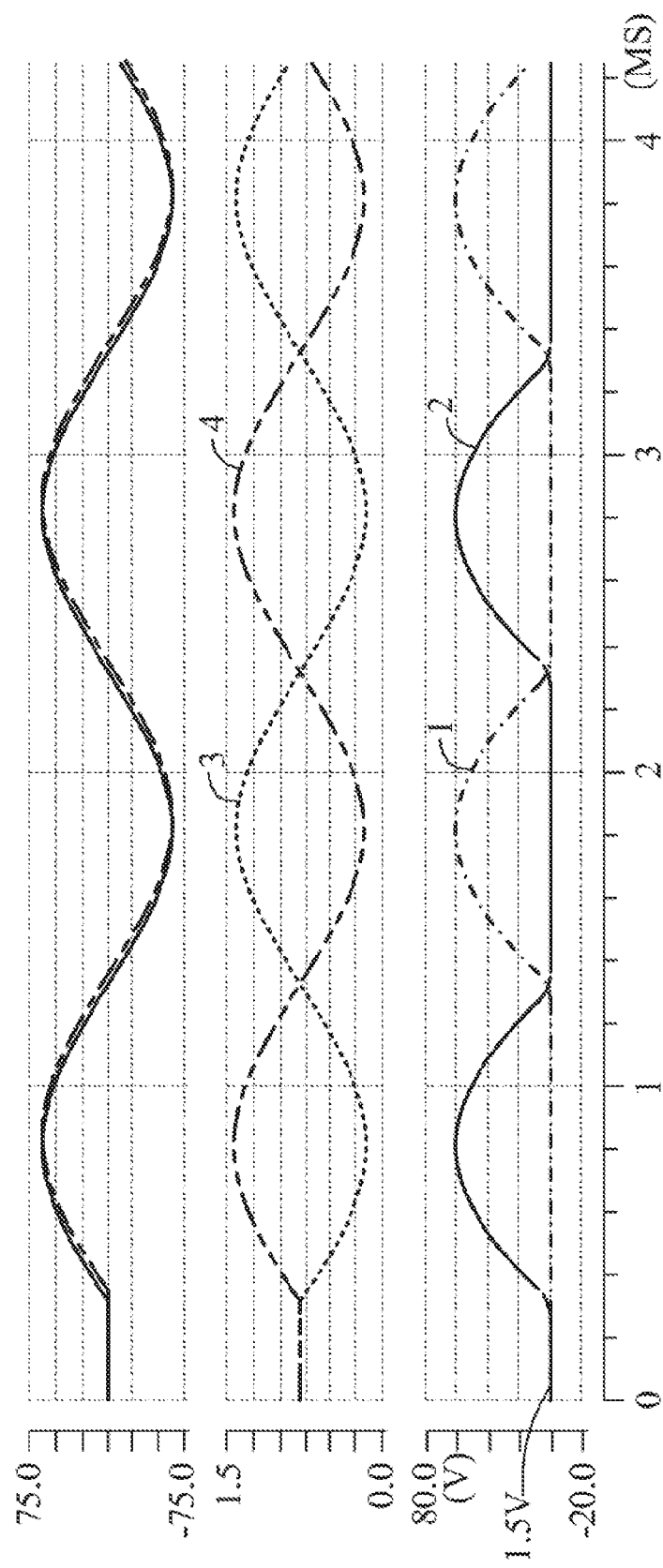
FIG. 5 is a schematic diagram of a working simulation of a common-mode feedback amplifier circuit according to an embodiment of the present disclosure.

FIG. 5 is a working simulation diagram of the common-mode feedback differential amplifier circuit as illustrated in FIG. 3. Solid line 1 and dotted line 2 in the lowermost waveform respectively denote waveforms of the first output signal and the second output signal first output terminal VON and the second output terminal VOP. As seen from the waveforms, the voltage of the signal with the lower voltage between the first output signal and the second output signal is about 1.5 V, which is the voltage of the first common-mode signal VCM1. Dotted line 3 and dotted line 4 in the middle waveform respectively denote signal waveforms of the first input terminal VIP and the second input terminal VIN. As seen from the waveforms, the signal at the first input terminal VIP and the signal at the second input terminal VIN are differential inputs, with amplitudes of about 1.5 V. The uppermost waveform is a whole-period simulation diagram of the first output signal and the second output signal. As seen from the waveform, the waveform of the output signal of the common-mode feedback differential circuit according to the present disclosure is a sine wave, with small total harmonic distortion (THD).

Figure 6:
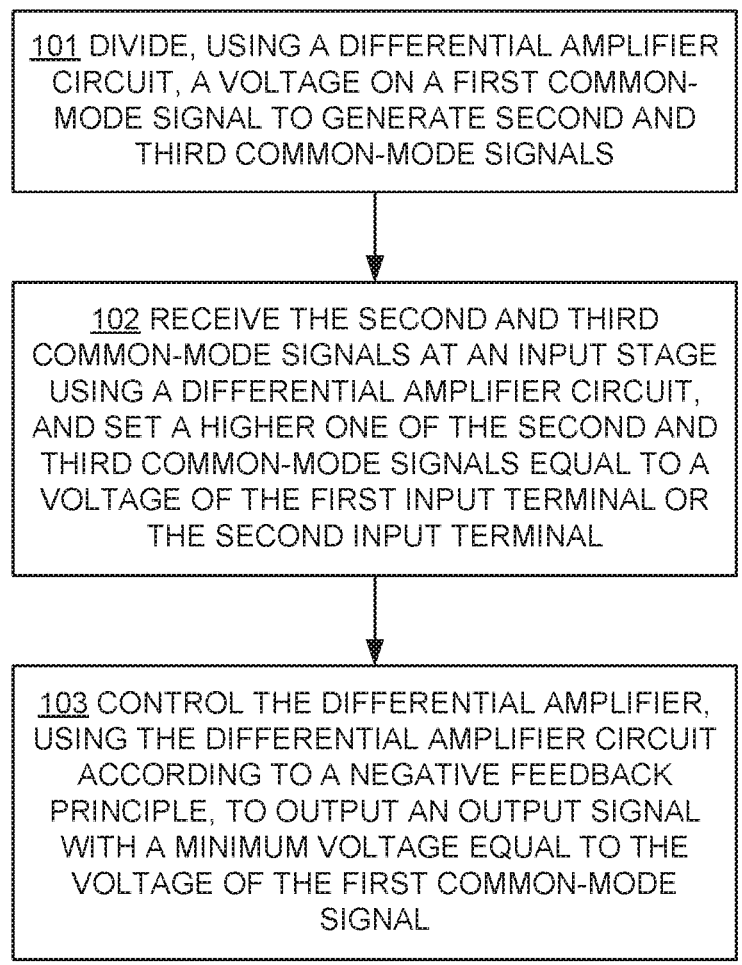
FIG. 6 is a schematic flowchart of a common-mode feedback amplification method according to an embodiment of the present disclosure.

Based on the above-described common-mode feedback differential amplifier circuit, an embodiment of the present disclosure further provides a common-mode feedback differential amplification method. As illustrated in FIG. 6, the method includes the following steps:

At 101, a differential amplifier circuit conducts voltage division on a first common-mode signal to generate a second common-mode signal and a third common-mode signal.

Specifically, voltage division is conducted for a voltage between a first input signal and the first common-mode signal to generate the second common-mode signal, and the second common-mode signal to the differential amplifier is output.

Voltage division is conducted for a voltage between a second input signal and the first common-mode signal to generate the third common-mode signal, and the third common-mode signal is output to the differential amplifier.

At 102, a differential amplifier in the differential amplifier circuit receives the second common-mode signal and the third common-mode signal at an input stage, and sets a voltage of a signal with the higher voltage between the second common-mode signal and the third common-mode signal equal to the voltage of the first input terminal or the second input terminal.

The setting of a voltage of a signal with the higher voltage between the second common-mode signal and the third common-mode signal equal to the voltage of the first input terminal or the second input terminal is equal to setting a common-mode selection circuit in an input-stage circuit, and selecting, by using the common-mode selection circuit, the voltage of the signal with the higher voltage between the second common-mode signal and the third common-mode signal equal to the voltage of the first input terminal or the second input terminal, wherein the common-mode voltage selection circuit may be formed by a current source and a MOS field-effect transistor, wherein the MOS transistor may be a PMOS transistor or an NMOS transistor. For example, the MOS transistor can be a PMOS transistor, as illustrated in FIG. 4, the common-mode voltage selection circuit is formed by a current source Q2 and first to sixth PMOS transistors P1-P6. When the voltage of the second common-mode signal VCM2 received by the first common-mode input terminal VC1 of the differential amplifier is higher than that of the third common-mode signal VCM2 received by the second common-mode input terminal VC2 of the differential amplifier, the voltage of the second common-mode signal VCM2 is equal to the voltage between the first input terminal VIP and the second input terminal VIN. When the voltage of the second common-mode signal VCM2 received by the first common-mode input terminal VC1 of the differential amplifier is lower than that of the third common-mode signal VCM3 received by the second common-mode input terminal VC2 of the differential amplifier, the voltage of the third common-mode signal VCM3 is equal to the voltage of the first input terminal VIP or the second input terminal VIN. Here, the positive pole of the current source Q2 is coupled to the internal power source VDD, and has no need to be coupled to the power source PVDD. The voltage of the internal power source VDD is by far lower than that of the power source PVDD, and therefore, power consumption caused by the current flowing through the first to sixth PMOS transistors P1-P6 is reduced.

At 103, the differential amplifier circuit controls, according to the negative feedback principle, the differential amplifier to output an output signal with a minimum voltage equal to a voltage of the first common-mode signal.

An embodiment of the present disclosure further provides an integrated circuit. The integrated circuit comprises the common-mode feedback differential amplifier circuit. As illustrated in FIG. 2, the differential amplifier circuit comprises a CMFB loop 11 and a differential amplifier 12.

The CMFB loop 11 conducts voltage division on a first common-mode signal to generate a second common-mode signal and a third common-mode signal, and outputs the second common-mode signal and the third common-mode signal to the differential amplifier 12. The differential amplifier 12 receives the second common-mode signal and the third common-mode signal at an input stage, and sets a voltage of the signal with the higher voltage between the second common-mode signal and the third common-mode signal equal to a voltage of a first input terminal or a second input terminal. The CMFB loop 11 controls, according to the negative feedback principle, the differential amplifier 12 to output an output signal with a minimum voltage equal to the voltage of the first common-mode signal.

The first common-mode signal may generally be acquired according to an input differential signal.

The first input signal and the second input signal are differential signals.

The CMFB loop 11 further comprises a first voltage divider circuit 111, a second voltage divider circuit 112, a first negative feedback circuit 113, and a second negative feedback circuit 114.

The first voltage divider circuit 111 conducts voltage division on a voltage between a first input signal and the first common-mode signal to generate the second common-mode signal, and outputs the second common-mode signal to the differential amplifier 12.

The second voltage divider circuit 112 conducts voltage division on a voltage between a second input signal and the first common-mode signal to generate the third common-mode signal, and outputs the third common-mode signal to the differential amplifier 12.

The first negative feedback circuit 113 controls, according to the negative feedback principle, the differential amplifier 12 to output a first output signal with a minimum voltage equal to the voltage of the first common-mode signal. Here, the first negative feedback circuit 113 employs a voltage divider circuit having the same voltage division proportion as the first voltage divider circuit 111 to enable the differential amplifier 12 to output the first output signal with the minimum voltage equal to the voltage of the first common-mode signal.

The second negative feedback circuit 114 controls, according to the negative feedback principle, the differential amplifier 12 to output a second output signal with a minimum voltage equal to the voltage of the first common-mode signal. Here, the second negative feedback circuit 114 employs a voltage divider circuit having the same voltage division proportion as the second voltage divider circuit 112 to enable the differential amplifier 12 to output the second output signal with the minimum voltage equal to the voltage of the first common-mode signal.

The differential amplifier 12 comprises an input-stage circuit 121, a gain-stage circuit 122, and an output-stage circuit 123.

The input-stage circuit 121 receives the second common-mode signal and the third common-mode signal, and sets the voltage of the signal with a higher voltage between the second common-mode signal and the third common-mode signal equal to the voltage of the first input terminal or the second input terminal. Here, the input-stage circuit 121 comprises a common-mode voltage selection circuit, and sets, by using the common-mode voltage selection circuit, the voltage of the signal with a higher voltage between the second common-mode signal and the third common-mode signal equal to the voltage of the first input terminal or the second input terminal; and the common-mode voltage selection circuit may be formed by a current source and a MOS field-effect transistor, wherein the MOS transistor may be a PMOS transistor or an NMOS transistor.

The gain-stage circuit 122 amplifies the first input signal and the second input signal.

The output-stage circuit 123 outputs, under control of the CMFB loop 11, a first output signal or a second output signal with a minimum voltage equal to the voltage of the first common-mode signal.

The specific circuit structure of the common-mode feedback differential amplifier circuit according to the present disclosure is described in detail hereinafter. As illustrated in FIG. 3, the common-mode feedback differential amplifier circuit comprises a CMFB loop formed by a first voltage divider resistor R1, a second voltage divider resistor R2, a third voltage divider resistor R3, a fourth voltage divider resistor R4, a fifth voltage divider resistor R5, a sixth voltage divider resistor R6, a first feedback resistor Rf1, and a second feedback resistor Rf2; and a differential amplifier A1.

In the CMFB loop, one terminal of the first voltage divider resistor R1 is coupled to the first common-mode signal VCM1, and the other terminal of the first voltage divider resistor R1 is coupled to the second voltage divider resistor R2 and a first common-mode input terminal VC1 of the differential amplifier A1. One terminal of the second voltage divider resistor R2 is coupled to a first input signal VI1, and the other terminal of the second voltage divider resistor R2 is coupled to the first voltage divider resistor R1 and the first common-mode input terminal VC1 of the differential amplifier. One terminal of the third voltage divider resistor R3 is coupled to the first common-mode signal VCM1, and the other terminal of the third voltage divider resistor R3 is coupled to the fourth voltage divider resistor R4 and a second common-mode input terminal VC2 of the differential amplifier A1. One terminal of the fourth voltage divider resistor R4 is coupled to a second input signal VI2, and the other terminal of the fourth voltage divider resistor R4 is coupled to the third voltage divider resistor R3 and the second common-mode input terminal VC2 of the differential amplifier A1. One terminal of the fifth voltage divider resistor R5 is coupled to the first input signal VI1, and the other terminal of the fifth voltage divider resistor R5 is coupled to the second feedback resistor Rf1 and the first input terminal VIP of the differential amplifier A1. One terminal of the sixth voltage divider resistor R6 is coupled to the second input signal VI2, and the other terminal of the sixth voltage divider resistor R6 is coupled to the second feedback resistor Rf2 and the second terminal of the differential amplifier A1. One terminal of the first feedback resistor Rf1 is coupled to the fifth voltage divider resistor R5 and the first input terminal VIP of the differential amplifier A1, and the other terminal of the first feedback resistor Rf1 is coupled to a first output terminal VON of the differential amplifier A1. One terminal of the second feedback resistor Rf2 is coupled to the sixth voltage divider resistor R6 and the second input terminal VIN of the differential amplifier A1, and the other terminal of the second feedback resistor Rf2 is coupled to a second output terminal VOP of the differential amplifier A1.

In the CMFB loop, the first voltage divider circuit is formed by the first voltage divider resistor R1 and the second voltage divider resistor R2, wherein the second common-mode signal VCM2 is generated at the middle point of the connection of the first voltage divider resistor R1 and the second voltage divider resistor R2. The second voltage divider circuit is formed by the third voltage divider resistor R3 and the fourth voltage divider resistor R4, wherein the third common-mode signal VCM3 is generated at the middle point of the connection of the third voltage divider resistor R3 and the fourth voltage divider resistor R4. The first negative feedback circuit is formed by the first feedback resistor Rf1. The second negative feedback circuit is formed by the second feedback resistor Rf2.

In the CMFB loop, the resistance ratio of the first voltage divider resistor R1 to the second voltage divider resistor R2 is the same as that of the first feedback resistor Rf1 and the fifth voltage divider resistor R5; the resistance ratio of the third voltage divider resistor R3 to the fourth voltage divider resistor R4 is the same as that of the second feedback resistor Rf2 to the sixth voltage divider resistor R6; and the second voltage divider resistor R2, the fourth voltage divider resistor R4, the fifth voltage divider resistor R5, and the sixth voltage divider resistor R6 may be variable resistors or switch capacitors.

When the common-mode feedback differential amplifier circuit as illustrated in FIG. 3 is operating, if the voltage of the first input signal VI1 is greater than that of the second input signal VI2, the voltage of the second common-mode signal VCM2 is greater than that of the third common-mode signal VCM3, the voltage of the first output signal output by the first output terminal VON of the differential amplifier A1 is less than that of the second output signal output by the second output terminal VOP, and the voltage of the second common-mode signal VCM2 set at the input stage of the differential amplifier A1 is equal to the voltage of the first input terminal VIP or the second input terminal VIN. In this way, since the voltage of the second common-mode signal VCM2 is acquired by voltage division by the first voltage divider resistor R1 and the second voltage divider resistor R2, the voltage of the first input terminal VIP is acquired by the first feedback resistor Rf1 and the fifth voltage divider resistor R5, and the resistance ratio of the first voltage divider resistor R1 to the second voltage divider resistor R2 is the same as that of the first feedback resistor Rf1 to the fifth voltage divider resistor R5, then the voltage of the first output signal output by the first output terminal VON is equal to that of the first common-mode signal VCM1. On the other hand, when the voltage of the second output signal output by the second output terminal VOP of the differential amplifier A1 is less than that of the first output signal output by the first output terminal VON, the voltage of the second output signal output by the second output terminal VOP is equal to that of the first common-mode signal VCM1.

In the common-mode feedback differential amplifier circuit as illustrated in FIG. 3, the differential amplifier A1 comprises an input-stage circuit, a gain-stage circuit, and an output-stage circuit. The input-stage circuit comprises the common-mode voltage selection circuit as illustrated in FIG. 4, and is configured to set the voltage of the signal with the higher voltage between the second common-mode signal VCM2 and the third common-mode signal VCM3 equal to the voltage of the first input terminal VIP or the second input terminal VIN. The common-mode voltage selection circuit may be formed by a current source Q2 and a MOS transistor. The MOS transistor may be a PMOS transistor or an NMOS transistor. FIG. 4 uses a PMOS transistor as an example. The common-mode voltage selection circuit is formed by a current source Q2 and a first PMOS transistor, a second PMOS transistor, a third PMOS transistor, a fourth PMOS transistor, a fifth PMOS transistor, and a sixth PMOS transistor. A positive pole of the current source Q2 is coupled to an internal power source VDD, and a negative pole of the current source Q2 is separately coupled to sources of the first PMOS transistor P1, the third PMOS transistor P3, and the fifth PMOS transistor P5. The gates of the first PMOS transistor P1 and the second PMOS transistor P2 are respectively the first input terminal VIP and the second input terminal VIN of the differential amplifier A1. A gate of the third PMOS transistor P3 is coupled to a gate of the sixth PMOS transistor P6, acts as the second common-mode input terminal VC2 of the differential amplifier A1, and is configured to receive the third common-mode signal VCM3. A gate of the fourth PMOS transistor P4 is coupled to a gate of the fifth PMOS transistor P5, acts as first common-mode input terminal VCI of the differential amplifier A1, and is configured to receive the second common-mode signal VCM2. Accordingly, the positive pole of the current source Q2 is coupled to a low-voltage internal power source VDD, instead of a high-voltage power source PVDD, thereby reducing power consumption caused by the current flowing through the first to sixth PMOS transistors P1-P6.

The above embodiments are merely preferred embodiments of the present disclosure, and are not intended to limit the protection scope of the present disclosure.

Additional Notes and Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A common-mode feedback differential amplifier circuit, comprising:
    a common-mode feedback (CMFB) loop; and
    a differential amplifier,
    wherein the CMFB loop is configured to perform voltage division on a first common-mode signal to generate a second common-mode signal and a third common-mode signal, output the second common-mode signal and the third common-mode signal to the differential amplifier, and control, according to a negative feedback principle, the differential amplifier to output an output signal with a minimum voltage equal to a voltage of the first common-mode signal, and
    wherein the differential amplifier is configured to receive the second common-mode signal and the third common-mode signal, set a higher one of voltages of the second common-mode signal and the third common-mode signal equal to a voltage of a first input terminal or a second input terminal, and output, under control of the CMFB loop, the output signal with the minimum voltage equal to the voltage of the first common-mode signal.

2. The differential amplifier circuit according to claim 1, wherein the CMFB loop comprises:
    a first voltage divider circuit configured to perform voltage division on a voltage between a first input signal and the first common-mode signal to generate the second common-mode signal, and output the second common-mode signal to the differential amplifier;
    a second voltage divider circuit configured to perform voltage division on a voltage between a second input signal and the first common-mode signal to generate the third common-mode signal, and output the third common-mode signal to the differential amplifier;
    a first negative feedback circuit configured to control, according to the negative feedback principle, the differential amplifier to output the first output signal with the minimum voltage equal to the voltage of the first common-mode signal; and
    a second negative feedback circuit configured to control, according to the negative feedback principle, the differential amplifier to output the second output signal with the minimum voltage equal to the voltage of the first common-mode signal.

3. The differential amplifier circuit according to claim 1, wherein the differential amplifier comprises:
    an input-stage circuit configured to receive the second common-mode signal and the third common-mode signal, and set the higher one of the voltages of the second common-mode signal and the third common-mode signal equal to the voltage of the first input terminal or the second input terminal;
    a gain-stage circuit configured to amplify the first input signal and the second input signal; and
    an output-stage circuit configured to output, under control of the CMFB loop, the first output signal or the second output signal with the minimum voltage equal to the voltage of the first common-mode signal.

4. The differential amplifier circuit according to claim 1, wherein the CMFB loop includes:
    first, second, third, fourth, fifth, and sixth voltage divider resistors;
    a first feedback resistor; and
    a second feedback resistor.

5. The differential amplifier circuit according to claim 4, wherein a first terminal of the first voltage divider resistor is coupled to the first common-mode signal and a second terminal of the first voltage divider resistor is coupled to the second voltage divider resistor and a first common-mode input terminal of the differential amplifier,
    wherein a first terminal of the second voltage divider resistor is coupled to a first input signal and a second terminal of the second voltage divider resistor is coupled to the first voltage divider resistor and the first common-mode input terminal of the differential amplifier,
    wherein a first terminal of the third voltage divider resistor is coupled to the first common-mode signal and a second terminal of the third voltage divider resistor is coupled to the fourth voltage divider resistor and a second common-mode input terminal of the differential amplifier,
    wherein a first terminal of the fourth voltage divider resistor is coupled to a second input signal and a second terminal of the fourth voltage divider resistor is coupled to the third voltage divider resistor and the second common-mode input terminal of the differential amplifier,
    wherein a first terminal of the fifth voltage divider resistor is coupled to the first input signal and a second terminal of the fifth voltage divider resistor is coupled to the first feedback resistor and the first input terminal of the differential amplifier, wherein a first terminal of the sixth voltage divider resistor is coupled to the second input signal and a second terminal of the sixth voltage divider resistor is coupled to the second feedback resistor and the second input terminal of the differential amplifier, wherein a first terminal of the first feedback resistor is coupled to the fifth voltage divider resistor and the first input terminal of the differential amplifier and a second terminal of the first feedback resistor is coupled to a first output terminal of the differential amplifier, and wherein a first terminal of the second feedback resistor is coupled to the sixth voltage divider resistor and the second input terminal of the differential amplifier and a second terminal of the second feedback resistor is coupled to a second output terminal of the differential amplifier.

6. The differential amplifier circuit according to claim 5, wherein a resistance ratio of the first voltage divider resistor to the second voltage divider resistor is the same as a resistance ratio of the first feedback resistor to the fifth voltage divider resistor, and wherein a resistance ratio of the third voltage divider resistor to the fourth voltage divider resistor is the same as a resistance ratio of the second feedback resistor to the sixth voltage divider resistor.

7. The differential amplifier circuit according to claim 6, wherein the second, fourth, fifth, and the sixth voltage divider resistors are variable resistors or switch capacitors.

8. The differential amplifier circuit according to claim 3, wherein the input-stage circuit comprises:
a common-mode voltage selection circuit including a current source and a metal-oxide-semiconductor (MOS) field-effect transistor.

9. The differential amplifier circuit according to claim 8, wherein, when the MOS transistor is a PMOS transistor, the common-mode voltage selection circuit includes first, second, third, fourth, fifth, and sixth PMOS transistors, wherein a positive pole of the current source is coupled to an internal power source and a negative pole of the current source is coupled to sources of the first PMOS transistor, the third PMOS transistor, and the fifth PMOS transistor;

wherein gates of the first and second PMOS transistors include the first and second input terminals of the differential amplifier, respectively, wherein a gate of the third PMOS transistor is coupled to a gate of the sixth PMOS transistor and includes a second common-mode input terminal of the differential amplifier configured to receive the third common-mode signal, and wherein a gate of the fourth PMOS transistor is coupled to a gate of the fifth PMOS transistor and includes first common-mode input terminal of the differential amplifier configured to receive the second common-mode signal.

10. A common-mode feedback differential amplification method, comprising:
dividing, by a differential amplifier circuit, a voltage on a first common-mode signal to generate second and third common-mode signals;
receiving the second and third common-mode signals at an input stage using a differential amplifier in the differential amplifier circuit,
setting a higher one of the second and third common-mode signals equal to a voltage of the first input terminal or the second input terminal; and controlling the differential amplifier, using the differential amplifier circuit according to a negative feedback principle, to output an output signal with a minimum voltage equal to the voltage of the first common-mode signal.

11. The differential amplification method according to claim 10, wherein the dividing, by a differential amplifier circuit, a voltage on a first common-mode signal to generate a second common-mode signal and a third common-mode signal comprises:
dividing a voltage between a first input signal and the first common-mode signal to generate the second common-mode signal;
outputting the second common-mode signal to the differential amplifier;
dividing a voltage between a second input signal and the first common-mode signal to generate the third common-mode signal; and
outputting the third common-mode signal to the differential amplifier.

12. The differential amplification method according to claim 10, wherein setting a higher one of voltages of the second common-mode signal and the third common-mode signal equal to the voltage of the first input terminal or the second input terminal comprises:
selecting, using a common-mode selection circuit in an input-stage circuit, a higher one of the voltages of the second common-mode signal and the third common-mode signal equal to the voltage of the first input terminal or the second input terminal.

13. An integrated circuit, comprising:
a common-mode feedback differential amplifier circuit, the differential amplifier circuit comprising:
a common-mode feedback (CMFB) loop; and
a differential amplifier,
wherein the CMFB loop is configured to perform voltage division on a first common-mode signal to generate a second common-mode signal and a third common-mode signal, output the second common-mode signal and the third common-mode signal to the differential amplifier, and control, according to a negative feedback principle, the differential amplifier to output an output signal with a minimum voltage equal to a voltage of the first common-mode signal, and
wherein the differential amplifier is configured to receive the second common-mode signal and the third common-mode signal, set a higher one of voltages of the second common-mode signal and the third common-mode signal equal to a voltage of a first input terminal or a second input terminal, and output, under control of the CMFB loop, the output signal with the minimum voltage equal to the voltage of the first common-mode signal.

14. The integrated circuit according to claim 13, wherein the CMFB loop comprises:
a first voltage divider circuit configured to perform voltage division on a voltage between a first input signal and the first common-mode signal to generate the second common-mode signal, and output the second common-mode signal to the differential amplifier;
a second voltage divider circuit configured to perform voltage division on a voltage between a second input signal and the first common-mode signal to generate the third common-mode signal, and output the third common-mode signal to the differential amplifier;
a first negative feedback circuit configured to control, according to the negative feedback principle, the differential amplifier to output the first output signal with the minimum voltage equal to the voltage of the first common-mode signal; and a second negative feedback circuit configured to control, according to the negative feedback principle, the differential amplifier to output the second output signal with the minimum voltage equal to the voltage of the first common-mode signal.

15. The integrated circuit according to claim 13, wherein the differential amplifier comprises:

an input-stage circuit configured to receive the second common-mode signal and the third common-mode signal, and set the higher one of the voltages of the second common-mode signal and the third common-mode signal equal to the voltage of the first input terminal or the second input terminal;

a gain-stage circuit configured to amplify the first input signal and the second input signal; and an output-stage circuit configured to output, under control of the CMFB loop, the first output signal or the second output signal with the minimum voltage equal to the voltage of the first common-mode signal.

16. The integrated circuit according to claim 13, wherein the CMFB loop includes:

first, second, third, fourth, fifth, and sixth voltage divider resistors;

a first feedback resistor; and a second feedback resistor.

17. The integrated circuit according to claim 16, wherein a first terminal of the first voltage divider resistor is coupled to the first common-mode signal and a second terminal of the first voltage divider resistor is coupled to the second voltage divider resistor and a first common-mode input terminal of the differential amplifier, wherein a first terminal of the second voltage divider resistor is coupled to a first input signal and a second terminal of the second voltage divider resistor is coupled to the first voltage divider resistor and the first common-mode input terminal of the differential amplifier, wherein a first terminal of the third voltage divider resistor is coupled to the first common-mode signal and a second terminal of the third voltage divider resistor is coupled to the fourth voltage divider resistor and a second common-mode input terminal of the differential amplifier, wherein a first terminal of the fourth voltage divider resistor is coupled to a second input signal and a second terminal of the fourth voltage divider resistor is coupled to the third voltage divider resistor and the second common-mode input terminal of the differential amplifier, wherein a first terminal of the fifth voltage divider resistor is coupled to the first input signal and a second terminal of the fifth voltage divider resistor is coupled to the first feedback resistor and the first input terminal of the differential amplifier, wherein a first terminal of the sixth voltage divider resistor is coupled to the second input signal and a second terminal of the sixth voltage divider resistor is coupled to the second feedback resistor and the second input terminal of the differential amplifier, wherein a first terminal of the first feedback resistor is coupled to the fifth voltage divider resistor and the first input terminal of the differential amplifier and a second terminal of the first feedback resistor is coupled to a first output terminal of the differential amplifier, and wherein a first terminal of the second feedback resistor is coupled to the sixth voltage divider resistor and the second input terminal of the differential amplifier and a second terminal of the second feedback resistor is coupled to a second output terminal of the differential amplifier.

18. The integrated circuit according to claim 17, wherein a resistance ratio of the first voltage divider resistor to the second voltage divider resistor is the same as a resistance ratio of the first feedback resistor to the fifth voltage divider resistor, and wherein a resistance ratio of the third voltage divider resistor to the fourth voltage divider resistor is the same as a resistance ratio of the second feedback resistor to the sixth voltage divider resistor.

19. The integrated circuit according to claim 18, wherein the second, fourth, fifth, and the sixth voltage divider resistors are variable resistors or switch capacitors.

20. The integrated circuit according to claim 15, wherein the input-stage circuit comprises:

a common-mode voltage selection circuit including a current source and a metal-oxide-semiconductor (MOS) field-effect transistor.

21. The integrated circuit according to claim 20, wherein, when the MOS transistor is a PMOS transistor, the common-mode voltage selection circuit includes first, second, third, fourth, fifth, and sixth PMOS transistors, wherein a positive pole of the current source is coupled to an internal power source and a negative pole of the current source is coupled to sources of the first PMOS transistor, the third PMOS transistor, and the fifth PMOS transistor;

wherein gates of the first and second PMOS transistors include the first and second input terminals of the differential amplifier, respectively, wherein a gate of the third PMOS transistor is coupled to a gate of the sixth PMOS transistor and includes a second common-mode input terminal of the differential amplifier configured to receive the third common-mode signal, and wherein a gate of the fourth PMOS transistor is coupled to a gate of the fifth PMOS transistor and includes a first common-mode input terminal of the differential amplifier configured to receive the second common-mode signal.

* * * * *